United States Patent

Satani et al.

[11] Patent Number: 6,058,067
[45] Date of Patent: *May 2, 2000

[54] MULTI-BANK SEMICONDUCTOR MEMORY DEVICE HAVING AN OUTPUT CONTROL CIRCUIT FOR CONTROLLING BIT LINE PAIRS OF EACH BANK CONNECTED TO DATA BUS PAIRS

[75] Inventors: Norihiko Satani; Tetsuya Mitoma, both of Miyazaki, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/083,885

[22] Filed: May 26, 1998

[30] Foreign Application Priority Data

May 30, 1997 [JP] Japan ..................... 9-140767

[51] Int. Cl.$^7$ ..................................................... G11C 8/00
[52] U.S. Cl. ............................... 365/230.06; 365/230.03
[58] Field of Search ........................ 365/230.06, 230.03, 365/205

[56] References Cited

U.S. PATENT DOCUMENTS

| | | | |
|---|---|---|---|
| 4,982,372 | 1/1991 | Matsuo | 365/230.03 |
| 5,136,543 | 8/1992 | Masuda et al. | 365/190 |
| 5,483,497 | 1/1996 | Mochizuki et al. | 365/230.03 |
| 5,668,774 | 9/1997 | Furutani | 365/233 |

FOREIGN PATENT DOCUMENTS 8-235869  9/1996  Japan .

*Primary Examiner*—David Nelms
*Assistant Examiner*—Hoai V. Ho
*Attorney, Agent, or Firm*—Jones Volentine, LLP

[57] ABSTRACT

The present invention provides a semiconductor integrated circuit that solves the aforementioned problems. A semiconductor integrated circuit of the present invention has a plurality of memory cells, for respectively storing data, bit line pairs supplied with data read from the memory cells and sense amplifiers for amplifying data supplied to the bit line pairs. The integrated circuit also has first and second data bus driving transistors, and a pair of data buses. The first data bus driver transistors each have a control terminal, for receiving data supplied to one bit line of the bit line pairs, a second terminal connected to a common node, and a third terminal, while the second data bus driver transistors each have a control terminal, for receiving data supplied to the other bit line of the bit line pairs, one terminal connected to the common node, and a third terminal. The integrated circuit of the present further has a transfer circuit, connected between the pair of data buses and the third terminals of the first and second data bus driver transistors, for electrically connecting the third terminals to the pair of data buses in response to a row select signal, and an output control circuit, connected to a first power supply potential node supplied with a first power supply potential, a second power supply potential node supplied with a second power supply potential, and the common node, for selectively connecting the common node to either the first power supply potential node or the second power supply potential node, in response to a control signal.

1 Claim, 5 Drawing Sheets

6,058,067

MULTI-BANK SEMICONDUCTOR MEMORY DEVICE HAVING AN OUTPUT CONTROL CIRCUIT FOR CONTROLLING BIT LINE PAIRS OF EACH BANK CONNECTED TO DATA BUS PAIRS

The present invention relates to a semiconductor integrated circuit, and particularly to a data bus driver circuit for a dynamic random access memory (hereafter referred to as DRAM).

Accompanying the increase in size of a DRAM, the demand for what is called consecutive access, where the content of memory cells arranged at consecutive addresses is read out consecutively, or written consecutively, has increased. In DRAM, the data bus must be precharged to a fixed potential for every access. Accordingly, in order to realize the above mentioned consecutive access, there is a method of dividing memory cell arrays into a plurality of banks, and alternately accessing these banks. With this method, the data buses of banks that are not being accessed can be maintained at the precharge level. Therefore, when there is an access for the data bus of a bank that was not accessed in the previous access, data can be read out smoothly. As a result, consecutive access can be realized at high speed.

However, in order to perform consecutive access, if the banks are simply divided up, there will have to be a data bus for each bank. This has given rise to a need for improvements to enlarge integrated circuits.

SUMMARY OF THE INVENTION

The present invention provides a semiconductor integrated circuit for solving the above mentioned problem. A semiconductor integrated circuit of the present invention has a plurality of memory cells, for respectively storing data, bit line pairs supplied with data read from the memory cells and sense amplifiers for amplifying data supplied to the bit line pairs. The integrated circuit also has first and second data bus driving transistors, and a pair of data buses. The first data bus driver transistors each have a control terminal, for receiving data supplied to one bit line of the bit line pairs, a second terminal connected to a common node, and a third terminal, while the second data bus driver transistors each have a control terminal, for receiving data supplied to the other bit line of the bit line pairs, one terminal connected to the common node, and third terminal.

The integrated circuit of the present further has a transfer circuit, connected between the pair of data buses and the third terminals of the first and second data bus driver transistors, for electrically connecting the third terminals to the pair of data buses in response to a row select signal, and an output control circuit, connected to a first power supply potential node supplied with a first power supply potential, a second power supply potential node supplied with a second power supply potential, and the common node, for selectively connecting the common node to either the first power supply potential node or the second power supply potential node, in response to a control signal.

DETAILED DESCRIPTION OF THE PREFERRED EMBODIMENTS

First Embodiment

Figure 1:
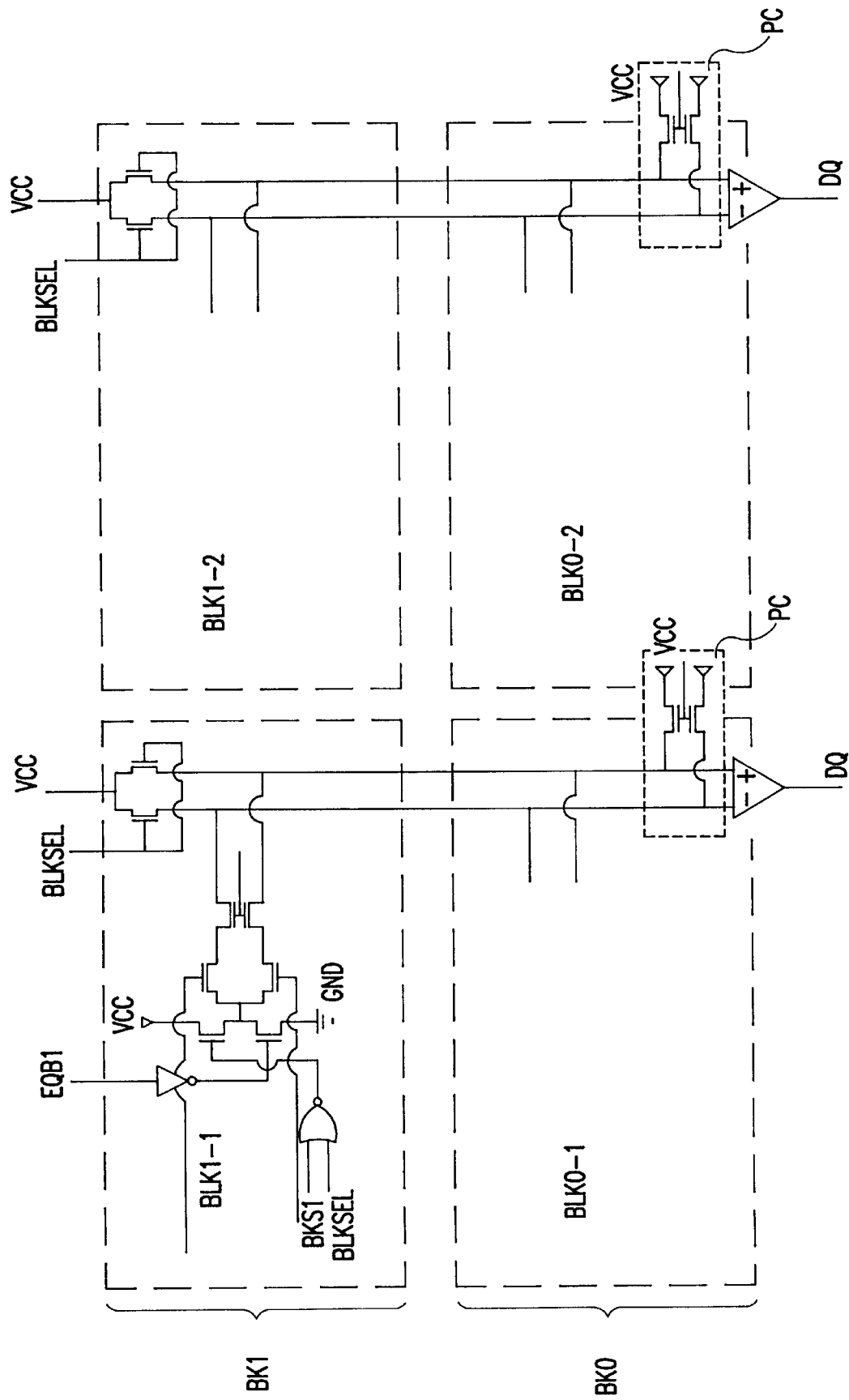
FIG. 1 is a schematic diagram of a DRAM of a first embodiment of the present invention.
Figure 2:
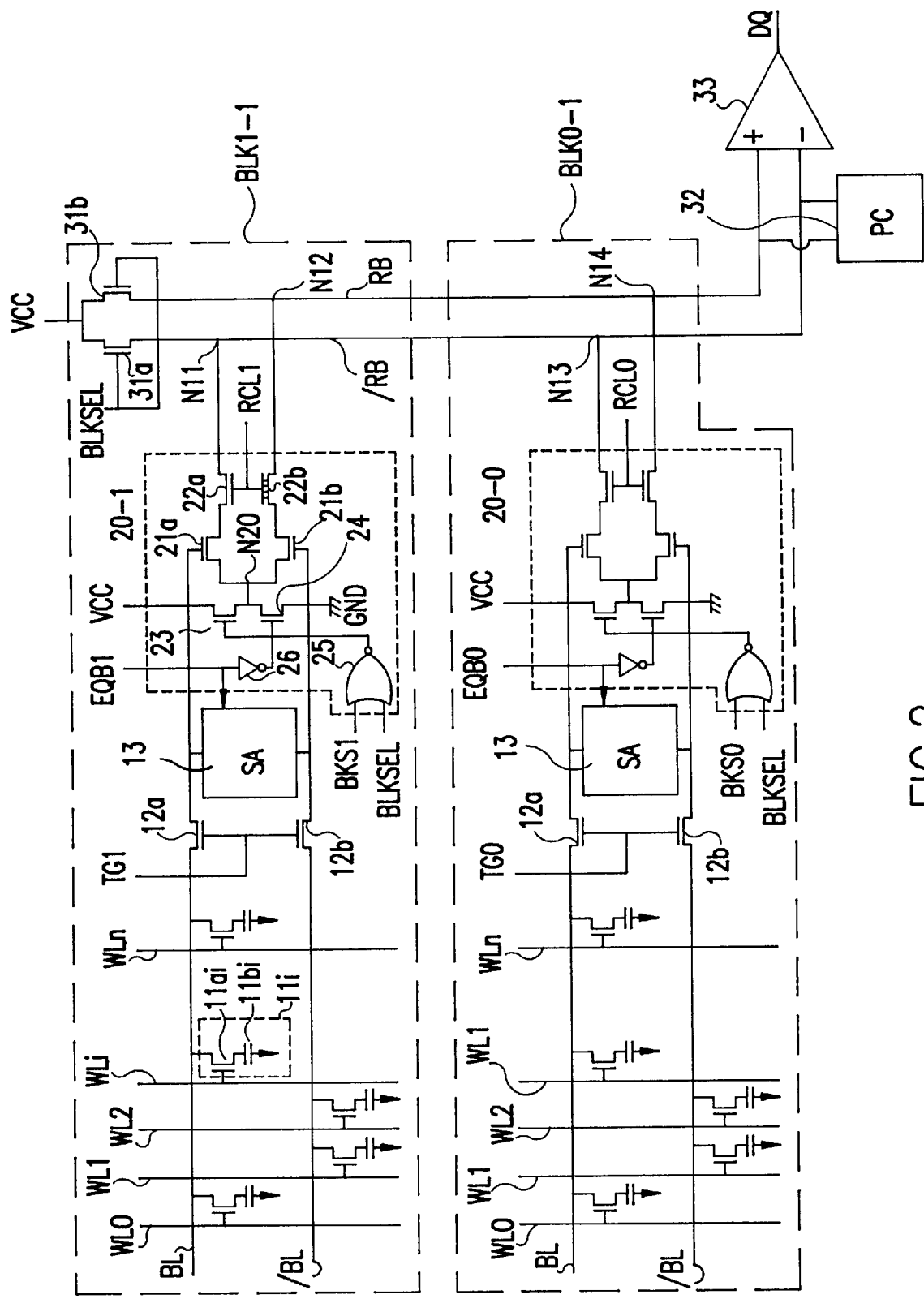
FIG. 2 is a schematic diagram of a DRAM of a first embodiment of the present invention.

FIG. 1 is a schematic diagram of a DRAM of the first embodiment of the present invention. This DRAM has two banks, BK0 and BK1, having the same configuration. Bank BK0 is divided into blocks BLK0-1 and BLK0-2, each having the same structure. Bank BK1 is also similarly divided in blocks BLK1-1 and BLK1-2, each having the same structure. FIG. 2 is a circuit diagram of blocks BLK0-1 and BLK1-1 of FIG. 1.

Bank BK1 has word line groups, comprising a plurality of word lines WL0, WL1 . . . , WLn arranged in parallel, and bit line pairs comprising two complementary bit lines B1, /BL, arranged so as to cross the word lines WL0~WLn. Memory cells $11i$, comprising MOS transistor $11ai$ and capacitor $11bi$, are connected to points of intersection of the word line WLi (where i=0~n) and bit line BL, or bit line /BL. When the memory cell $11i$ has been selected by word line WLi, a potential supplied to bit line BL or /BL is maintained, while outputting that maintained potential to bit line BL or bit line /BL. Bit lines BL and /BL are connected to input sides of sense amplifiers through respective MOS transistors $12a$ and $12b$ used as switches. A signal TG1 for read control is supplied to the gates of MOS transistor $12a$ and MOS transistor $12b$. A block select signal EQB1 is supplied to the sense amplifiers 13 for controlling the operation of the sense amplifiers. These bit lines BL, /BL, word lines WL0~WLn, memory cells $11i$ and sense amplifier 13 constitute a first storage means.

First output control means (an output control circuit or data bus driver circuit) 20-1 is connected to the output side of the sense amplifier 13. The output control circuit 20-1 is controlled by two complementary output signals of the sense amplifier 13, and potentials depending on these sense amplifier output signals are respectively output to first and second nodes (for example node N11 and N12).

The output control circuit 20-1 has first and second transistors (for example MOS transistors) $21a$, $21b$, and the gates of these MOS transistors $21a$, $21b$ are respectively connected to the two output sides of the sense amplifier 13. The sources of the MOS transistors $21a$, $21b$ are commonly connected to internal nodes (for example, node N21) while the drains are respectively connected to nodes N11 and N12 through MOS transistors $22a$, $22b$. A select read signal RCL1 is supplied to the gates of MOS transistors $22a$ and $22b$. Drains of third and fourth transistors (for example MOS transistors) 23, 24 are commonly connected to node N20. Power supply potential VCC is connected to the source of MOS transistor 23 and ground potential GND is connected to the source of MOS transistor 24. The gate of MOS transistor 23 is controlled by an output signal from NOR circuit 25 giving the logical NOR of a bank select signal BKS1 and a common block select signal BLKSEL. A block select signal EQB1 is supplied to the gate of MOS transistor 24 through an inverter 26.

On the other hand, block BLK0-1 also has the same configuration as block BLK1-1. The output side of the sense amplifier 13 of this block BLK0-1 is connected to third and fourth nodes (for example, node N13 and node N14) via second output control means (an output control circuit or data bus driver circuit) 20-0, having the same structure as the above mentioned output control circuit 20-1. The output control circuit 20-0 of block 0-1 side is controlled by a select read signal RCL0, the logical NOR of a bank select signal BKS0 and a common block select signal BLKSEL, and a block select signal EQB0.

Node N11 and node N13 are connected by a first data bus (for example, a read data bus) /RB, while node N12 and node N14 are connected by a second data bus (for example, a read data bus) RB. One end of these complementary read data buses /RB and RB is connected to the power supply potential VCC through MOS transistor 31a and MOS transistor 31b that are ON/OFF controlled by the common block select signal BLKSEL. The other ends of the read data buses /RB, and RB are connected to precharge means (for example a precharge circuit) 32, and the output side of this precharge circuit 32 is connected to the input side of read means (for example a read amplifier) 33. The contents of a memory cell 11i that has been selected in block BLK0-1 or BLK1-1 is output from the read amplifier 33 as read data DQ.

Next, the operation of this DRAM will be described.

Here, the operation will be described for the case where, for example, bank BK1 is changed from a stand-by state to an active state, and data stored in the memory cell 11i of block BLK1-1 is read out.

When block BLK1-1 is in the stand-by state, the block select signal EQB1 is at an 'H' level, so a signal supplied to the gate of MOS transistor 24 through the inverter 26 is an 'L' level. Since bank BK1 to which the block BLK1-1 is attached is not selected, the bank select signal BKS1 is at the "H" level, and an "L" level signal is applied to a gate of the MOS transistor 23 from the NOR circuit 25. Therefore, the MOS transistor 23 and MOS transistor 24 are both put in an OFF state and no current flows in the output control circuit 20-1, so there is a disconnected state between this output control circuit 20-1 and nodes N11 and N12 of the read data buses /RB and RB. Accordingly, the potential of the read data buses /RB and RB is precharged to VCC–Vt by the precharge circuit 32.

Next, the block BLK1-1 of bank BK1 is selected. The bank select signal BKS1 and block select signal EQB1 change to 'L' level, while the common block select signal BLKSEL, select read signal RCL1 and signal TG1 change to 'H' level, and this block BLK1-1 is put in the active state. As a result, MOS transistor 23 is in an OFF state and MOS transistor 23 is changes to an ON state, and the potential of node N20 becomes substantially equal to ground potential GND.

If the word line WLi of the selected block BLK1-1 is set to the 'H' level, data stored in a memory cell 11i connected to this word line Wli is output to the bit line pair BL, /BL. The data that has been output to the bit line pair BL, /BL is supplied to the sense amplifier 13 through MOS transistor 12a and MOS transistor 12b that have been put into an ON state by signal TG1, and respectively output to the gates of MOS transistor 21a and MOS transistor 21b.

If the data stored in memory cell 11i is set to the 'H' level, the level of the gates of MOS transistor 21a and MOS transistor 21b respectively become 'H' and 'L'. As a result, the MOS transistor 21a is in the ON state and the MOS transistor 21b is in the OFF state. Also, since the level of the select read signal RCL1 has become 'H', both of the MOS transistor 22a and the MOS transistor 22b are in the ON state. Node 11 is therefore connected to ground potential GND through MOS transistor 22a and MOS transistor 21a. On the other hand, since MOS transistor 21b is in the OFF state, the potential of node 12 remains at the precharged potential. Accordingly, the levels of the read data buses RB and /RB are respectively 'H' and 'L' signals on the read data buses RB and /RB are supplied to the read amplifier 33 through the precharge circuit 32, and 'H' is output by this read amplifier 33 as read data DQ.

If the data stored in memory cell 11i is set to the 'L' level, the level of the gates of MOS transistor 21a and MOS transistor 21b respectively become 'L' and 'H', which means that the MOS transistor 21a is in the OFF state and the MOS transistor 21b is in the ON state. As a result, 'L' is output as read data DQ.

While block BLK1-1 is executing the read of the selected memory cell 11i, the unselected blocks BLK1-2 and BLK0-2 are in the standby state. For example, in block BLK1-2, bank select signal BKS1 and common block select signal BLKSEL are 'L', while block select signal EQB1, select read signal RCL1 and signal TG1 are 'H'. This causes the MOS transistor 23 to be in the ON state and the MOS transistor 24 to be in the OFF state, the potential of node N20 to be VCC–Vt, that is, it equals the potential of the read data buses RB and /RB. Accordingly, no current flows in the output control circuit 20-1, regardless of whether MOS transistors 21a and 21b are ON or OFF, and a disconnected state exists between the output control circuit 20-1 and node N11 and N12 of the read data buses RB and /RB.

Accordingly, the potential of the read data buses RB and /RB is maintained at VCC–Vt. This means that when BLK1-2 and block BLK0-2 are next selected, it is possible to immediately output stored data of the memory cell 11i selected by word line Wli. That is, the read is completed without the operation of precharging the data bus or in a reduced time.

As has been described above, this first embodiment has output control circuit 20-1 and output control circuit 20-0 whose conducting states are controlled by bank select signals BKS1 and BKS0, block select signals EQB1 and EQB0 and common block select signal BLKSEL. In this way, read data buses RB and /RB can be made common for two banks BK0 and BK1, which means that it is possible to reduce the surface area required for layout. Further, it is possible to put the remaining unselected bank BK0 (or BK1) and blocks into a standby state while a specified block of a selected bank BK1 (or BK0) is being accessed, which means that it becomes possible to alternately consecutively access two banks BK0 and BK1 and achieve consecutive access.

Second Embodiment

Figure 3:
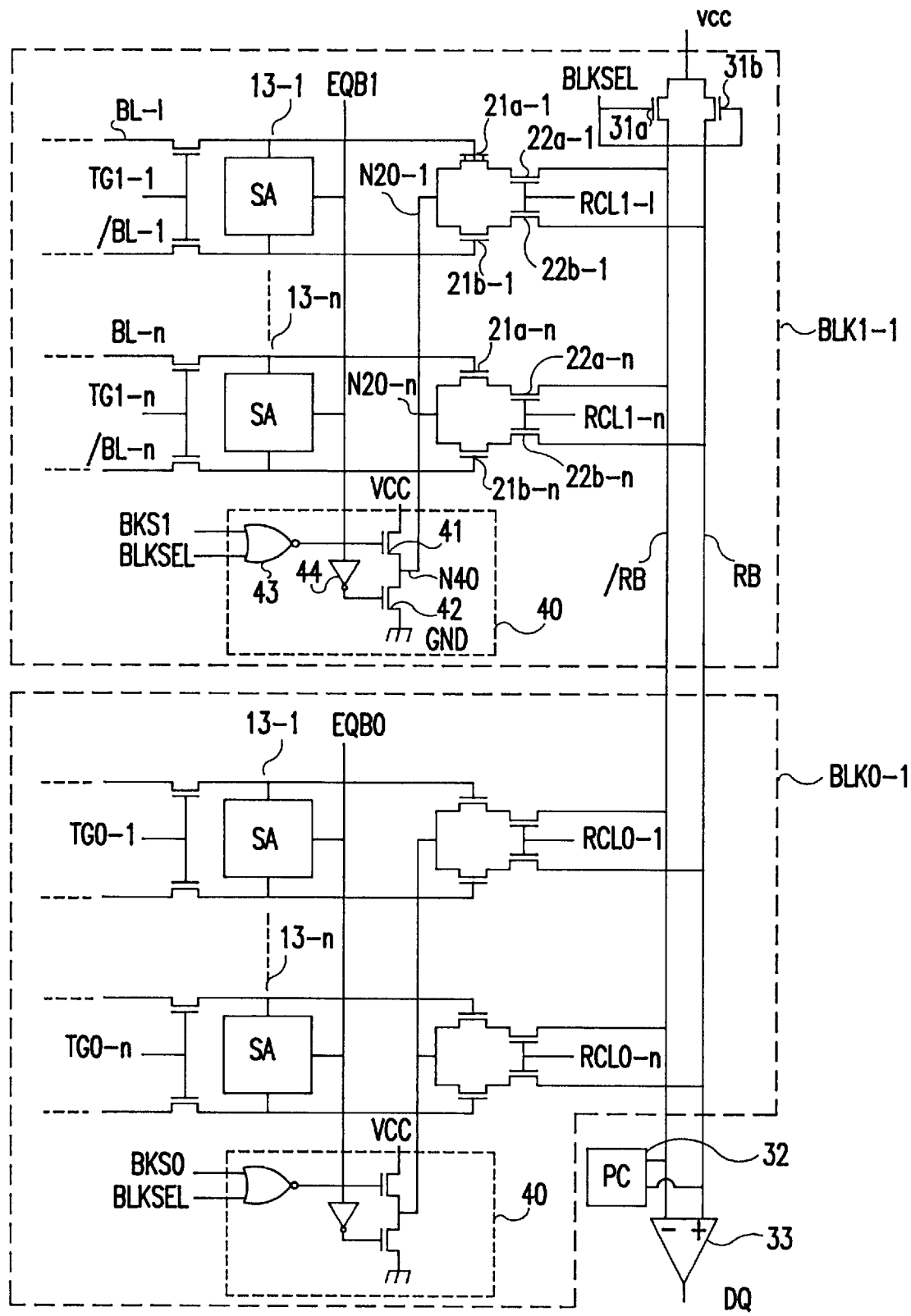
FIG. 3 is a schematic diagram of a DRAM of a second embodiment of the present invention.

FIG. 3 is a schematic drawing showing a DRAM of a second embodiment of the present invention, and elements that are common to FIG. 1 and FIG. 2 of the first embodiment have the same reference numerals attached thereto.

In the DRAM of this second embodiment, the output control circuit 20-1 of the DRAM in FIG. 2 is simplified.

The output control circuits 20-1 of FIG. 2 are provided one per sense amplifier 13, but in the DRAM of FIG. 3, part of the output circuit is commonly used for a plurality of sense amplifiers 13-1~13-n.

That is, gates of respective MOS transistors 21a-i, 21b-i are connected to the output side of each sense amplifier 13-i (where i=1~n) inside block BLK1-1. The drains of MOS transistors 21a-i, 21b-i are connected to read data buses RB and /RB via respective MOS transistors 22a-i and 22b-i, and the sources are commonly connected to internal node N20-i.

On the other hand, the DRAM in FIG. 3 has each internal node N20-i commonly connected, and connected to node N40 of the control circuit 40. The control circuit 40 is comprised of MOS transistor 41, MOS transistor 42, NOR circuit 43 and inverter 44. The source of MOS transistor 41 and the drain of MOS transistor 42 are connected to node N40. The drain of MOS transistor 41 is connected to power supply voltage VCC, while the gate of MOS transistor 41 is connected to the output side of NOR circuit 43. This MOS transistor 41 is ON/OFF controlled by logical NOR of the bank select signal BKS1 and the common block select signal BLKSEL. The drain of the MOS transistor 42 is connected to ground potential GND and the gate of MOS transistor 42 is connected to block select signal EQB1 via an inverter 44. The MOS transistor 42 is switched on and off by this block select signal EQB1.

The output side circuit of the sense amplifiers 13-1 inside block BLK0-1 has the same structure as that of block BLK1-1. The rest of the configuration is the same as in FIG. 2. Therefore, the operation of the DRAM of the second embodiment is the same as the operation of the DRAM of the first embodiment, except that the potential of internal nodes N20-i of block BLK0-1 are commonly controlled by the control circuit 40, and it has the same advantages as the DRAM of the first embodiment.

Further, this DRAM of the second embodiment has a common control circuit 40 provided for every sense amplifier 13-i, which means there is the advantage that the circuit structure can be simplified.

Third Embodiment

Figure 4:
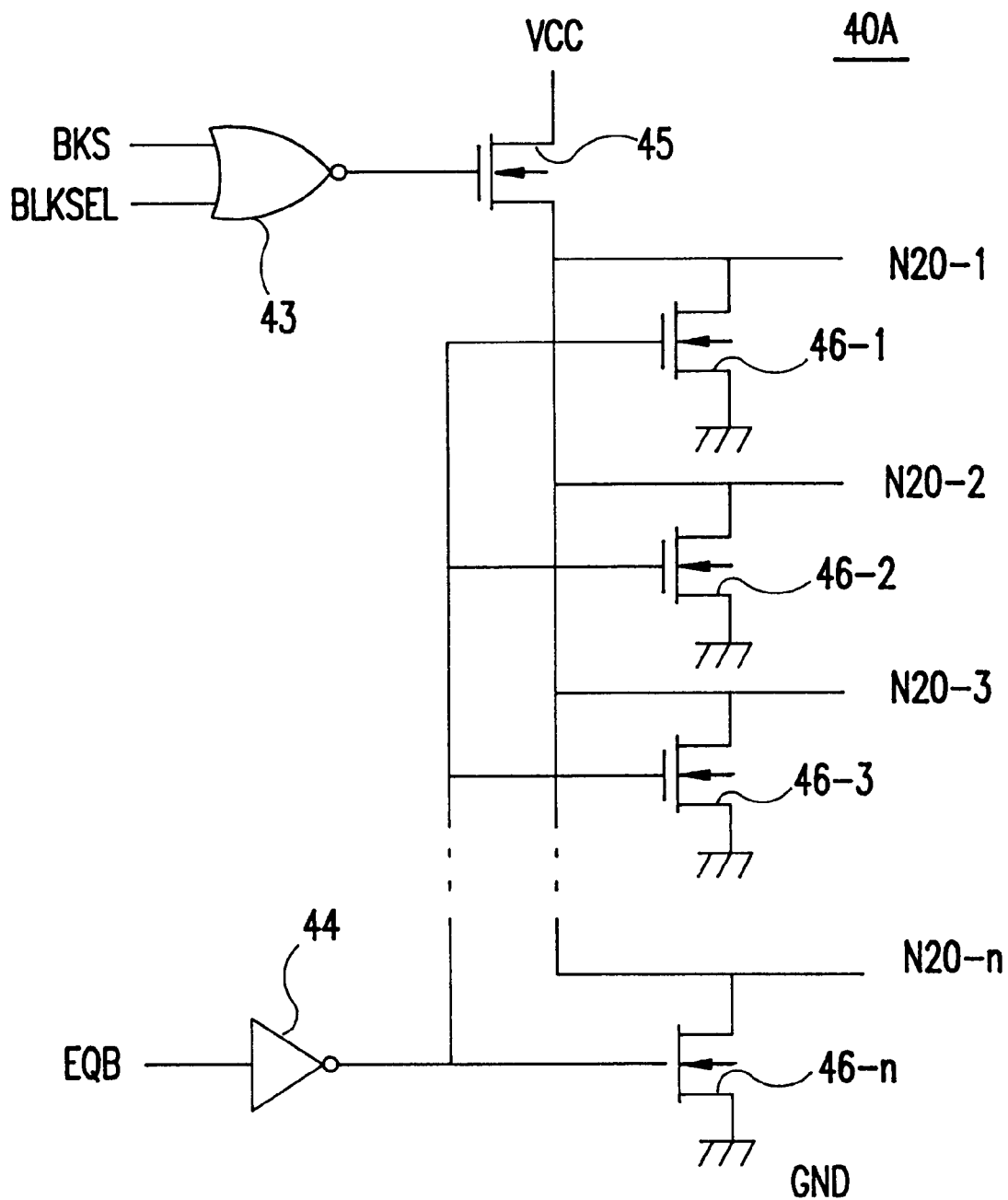
FIG. 4 is a schematic diagram of a DRAM of a third embodiment of the present invention.

FIG. 4 is a schematic diagram of a control circuit for a DRAM of a third embodiment of the present invention. This control circuit 40A replaces the control circuit 40 in the DRAM of the second embodiment shown in FIG. 3, and elements in FIG. 4 that are common to FIG. 2 have the same reference numerals attached thereto.

This control circuit 40A has an N-channel MOS transistor (hereafter referred to as NMOS transistor) 45 connected between the power supply voltage VCC and node N40. The gate of NMOS transistor 45 is connected to the output side of NOR circuit 43. A plurality of NMOS transistors 46-1, 46-2~46-n are connected in parallel across node N40 and ground potential GND, and the output side of inverter 44 is commonly connected to the gates of these NMOS transistors 46-1, 46-2~46-n. The drain of each NMOS transistor 46-1~46-n is respectively connected to node N20-1~N20-n of FIG. 4.

The operation of the control circuit 40A having such a structure is the same as the operation of the control circuit 40 in FIG. 3, and has the same advantages as the DRAM of the second embodiment.

Fourth Embodiment

Figure 5:
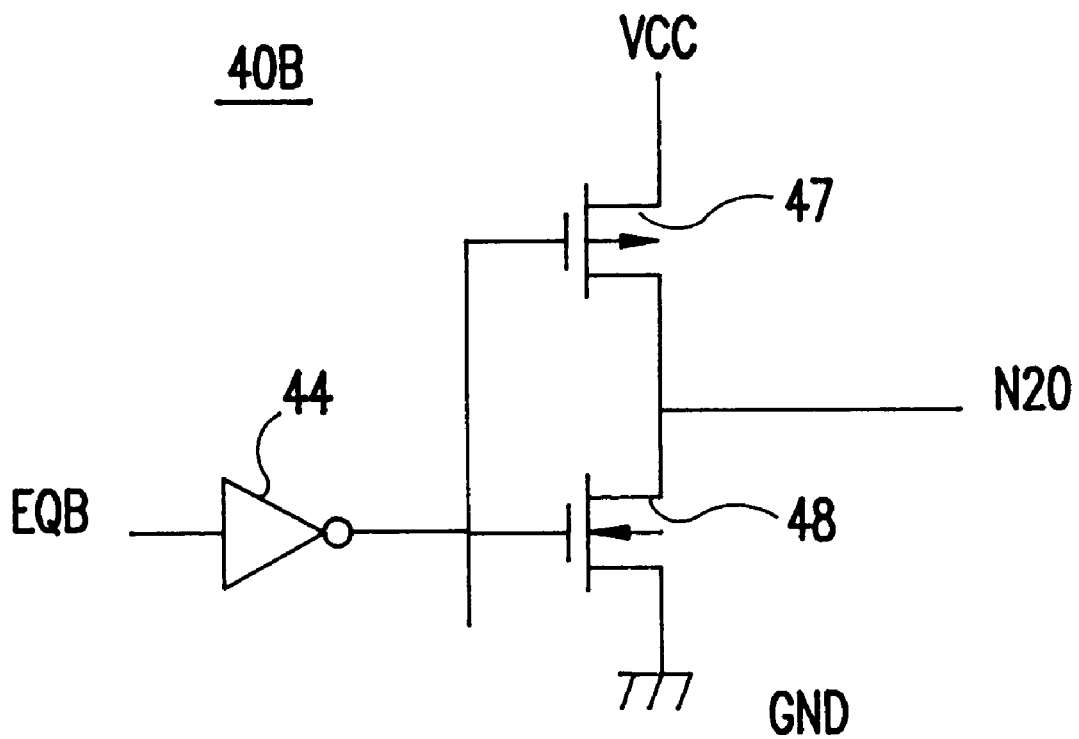
FIG. 5 is a schematic diagram of a DRAM of a fourth embodiment of the present invention.

FIG. 5 is a schematic diagram of a control circuit for DRAM of a fourth embodiment of the present invention. This control circuit 40B is provided in place of the control circuit 40 in the DRAM of the second embodiment shown in FIG. 3, and elements in FIG. 4 that are common to FIG. 3 have the same reference numerals attached thereto.

This control circuit 40B has a P-channel MOS transistor (hereafter referred to as PMOS transistor) 47 connected between the power supply potential VCC and node N40. An NMOS transistor 48 is connected between the node N40 and ground potential GND. The gates of the PMOS transistor 48 and the NMOS transistor 48 are commonly connected to the output side of the inverter 44.

This control circuit 40B carries out control so that when the block select signal EQB is at the 'H' level, node N40 is at the 'H' level, and when the block select signal EQB is at the 'L' level, node N40 is at the 'L' level, and the potential of node N40 can be simply controlled without using the bank select signal BKS or the common block select signal BLKSEL. As a result, it is possible to carry out the operation of the control circuit 40 in FIG. 4 with an even more simplified circuit structure, and it has the same advantages as the DRAM of the second embodiment.

The present invention is not limited to the embodiments described above, and various modifications are possible. Possible modifications are such as the examples given in (a) to (e) below.

(a) The present invention has been described for a DRAM, but it is applicable to other semiconductor storage devices requiring precharging.

(b) Description has been given for a semiconductor storage device having a two bank structure, but it is also applicable to a semiconductor storage device having three or more banks.

(c) The circuit structure of the output control circuit 20-1 etc. in FIG. 2 is not limited to those illustrated, and it is possible to obtain the same effects with any circuit structure as long as the circuit has the same function.

(d) In the DRAM of FIG. 3, one control circuit 40 is provided for one bank, but it is also possible to provide a plurality of control circuits 40 for one bank, according to the layout.

(e) The output control circuit 20, control circuit 40 etc. are all made using MOS transistors, but it is also possible to make them as other than MOS transistors, for example bipolar transistors.

As has been described in detail above, according to the present invention first and second output control means are provided in first and second storage means, to control the connection states between respective common data buses. As a result, for example, when data of the first storage means is being read the second storage means is disconnected from the bus, and the output potential of the second storage means can be held to a specified potential by precharge means. This means that it is possible to consecutively read alternately from the first and second storage means via common data buses, and layout can be reduced in size without prolonging access time.

According to the present invention, output control means is comprised of transistors being switched on and off by a designation signal for designating storage means, and a sense signal that has been read from designated storage means. In this way, simplification and miniaturization of the circuit is possible.

What is claimed is:

1. A semiconductor integrated circuit comprising:

a plurality of memory cells, respectively storing data;

bit line pairs supplied with data read from said memory cells;

sense amplifiers for amplifying data supplied to said bit line pairs;

first data bus driver transistors, each having a control terminal, for receiving data supplied to one bit line of said bit line pairs, a second terminal connected to a common node, and a third terminal;

second data bus driver transistors each having a control terminal, for receiving data supplied to the other bit line of said bit line pairs, a second terminal connected to said common node, and a third terminal;

a pair of data buses;

a transfer circuit, connected between said pair of data buses and the third terminals of said first and second data bus driver transistors, for electrically connecting said third terminals to said pair of data buses in response to a row select signal; and an output control circuit, connected to a first power supply potential node supplied with a first power supply potential, a second power supply potential node supplied with a second power supply potential, and said common node, for selectively connecting said common node to either said first power supply potential node or said second power supply potential node, in response to a control signal.

* * * * *